United States Patent [19]
Jun et al.

[11] Patent Number: 5,412,331
[45] Date of Patent: May 2, 1995

[54] WORD LINE DRIVING CIRCUIT OF A SEMICONDUCTOR MEMORY DEVICE

[75] Inventors: Dong S. Jun, Seoul; Seung C. Oh, Suwon; Moon G. Kim, Suwon; Sung G. Lee, Suwon, all of Rep. of Korea

[73] Assignee: Samsung Electronics Co., Ltd., Kyungki-do, Rep. of Korea

[21] Appl. No.: 143,894

[22] Filed: Nov. 1, 1993

[30] Foreign Application Priority Data

Oct. 31, 1992 [KR] Rep. of Korea ............... 1992-20343
Aug. 11, 1993 [KR] Rep. of Korea ............... 1993-15514

[51] Int. Cl.⁶ .................................................. H03K 3/01
[52] U.S. Cl. .................................. 326/105; 326/121; 365/230.06; 327/306; 327/108
[58] Field of Search ............... 307/463, 451, 264, 108, 307/475; 365/230.06

[56] References Cited

U.S. PATENT DOCUMENTS 4,571,510  2/1986  Seki et al. ................ 307/463
5,018,107  5/1991  Yoshida .................... 307/451

FOREIGN PATENT DOCUMENTS 0171718  8/1986  European Pat. Off. ....... 365/230.06
0275397  11/1987  Japan ......................... 365/230.06

*Primary Examiner*—Timothy P. Callahan
*Assistant Examiner*—Jung Kim
*Attorney, Agent, or Firm*—Robert A. Westerlund; Stephen R. Whitt

[57] ABSTRACT

A word line driving circuit for use in a semiconductor memory device having a first supply voltage terminal to which a pumping voltage higher than a supply voltage supplied from the exterior of a chip is applied and a second supply voltage terminal to which a ground voltage is applied includes a decoding circuit connected between the first supply voltage terminal and second supply voltage terminal, for receiving a decoded row address, a precharge circuit connected to an output terminal of the decoding circuit, a transfer circuit for receiving an output signal of the decoding circuit and a word line boosting signal, and a word line output circuit connected between the first supply voltage terminal and second supply voltage terminal, for driving a word line.

9 Claims, 8 Drawing Sheets

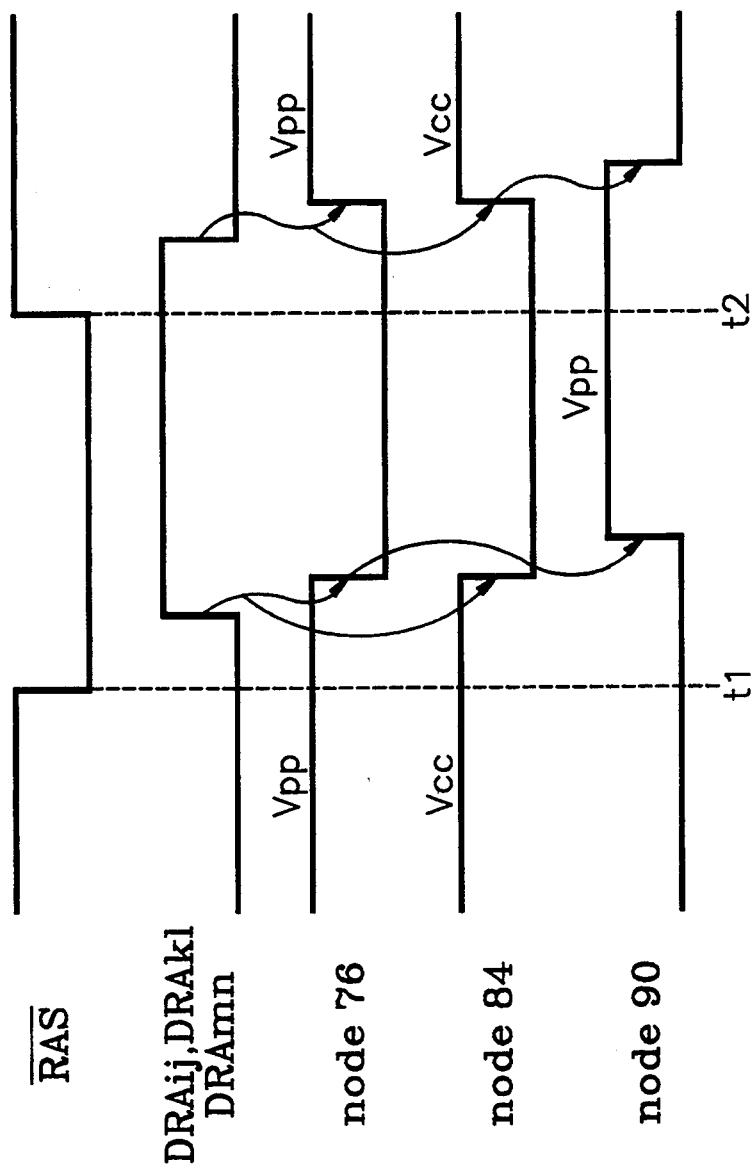

WORD LINE DRIVING CIRCUIT OF A SEMICONDUCTOR MEMORY DEVICE

BACKGROUND OF THE INVENTION

The present invention relates to semiconductor memory devices, and more particularly to a word line driving circuit for driving a word line by decoding a row address.

Typically, each memory cell of a dynamic random access memory (DRAM) includes one access transistor and one storage capacitor and data is stored in the storage capacitor. The data stored in the storage capacitor is transferred to a bit line through the channel of the access transistor. When the data is transferred to the bit line, the transfer speed and the voltage level of the bit line are determined by the voltage level of the word line applied to the gate of the access transistor. However, in the case of a highly integrated semiconductor memory device using a low supply voltage, since the voltage level of the word line applied to the gate of the access transistor is not great enough to transfer the data stored in the storage capacitor to the bit line, there are disadvantages such as the reduction of the operating speed of the memory device.

FIG. 1 illustrates a conventional word line driving circuit of a semiconductor memory device having a bootstrap circuit, and FIG. 2 a timing chart showing the operation of the circuit of FIG. 1. The circuit structure of FIG. 1 is well known in the art as a row decoder. Hereinafter it is referred to as a word line driving circuit. Referring to FIG. 1, a boosting signal $\phi X$ is transferred to a word line WL through an NMOS transistor 9 having its source electrode connected thereto. The boosting signal $\phi X$ is generated from a peripheral circuit located outside of a memory array block and is driven to a voltage level of $Vcc + 2Vt$ (Vt is a threshold voltage of a transistor) during an active cycle of a chip. If the boosting signal $\phi X$ is transferred to the word line, the data stored in the storage capacitor is transferred to the bit line through the channel of the access transistor of the memory cell. Decoded row address signals DRAij, DRAkl and DRAmn are related to block selection. Referring to FIG. 2, a signal $\phi ORD$ is a delayed signal of a row strobe signal/RAS and directly enables each operating signal of FIG. 1. If the row address strobe signal/RAS is an active state, a signal PDPX is set to logic "high" level and a precharge transistor 1 is turned off. Then a row address passing through a predecoder (not shown and positioned at each input portion of a row decoder or a column decoder) is applied. If all the decoded row address signals DRAij, DRAkl and DRAmn are logic "high" level, a node n1 is set to logic "low" level. Then a node n2 for controlling the word line WL is precharged to a level of $Vcc-Vt8$ (Vt8 is the threshold voltage of an NMOS transistor 8). Thereafter if the boosting signal $\phi X$ is applied, the node n2 is self-boosted through the NMOS transistor 9 and the boosting signal $\phi X$ is transferred to the word line WL through the NMOS transistor 9.

In the circuit of FIG. 1, the node n2 should be precharged to a level of $Vcc-Vt8$ before the boosting signal $\phi X$ is applied. However, at a low supply voltage, since the precharge level of the node n2 is not sufficient, the operating characteristic deteriorates and the voltage boosting level of the word line WL is reduced. In addition, since the boosting signal $\phi X$ should be applied after the node n2 is sufficiently precharged, the operating speed is reduced. In this case, since the node n2 is set to a level of $Vcc-Vt8 + \phi X$ instead of a constant voltage level, the reliability of the word line driving circuit is lowered. In the meanwhile, if the voltage level of the word line WL is raised, the gate-source voltage Vgs of the NMOS transistor 9 is reduced, and thus, a charge sharing operation between the word line WL and the boosting signal $\phi X$ through the channel of the NMOS transistor 9 is insufficiently performed at a falling part of the voltage level of the boosting signal $\phi X$.

Another example of a conventional word line driving circuit which overcomes the aforementioned problems is shown in FIG. 3. The circuit of FIG. 3 is described in a paper by K. Komatsuzaki et al. entitled, "Circuit Techniques for a Wide Word I/O Path 64 Mega DRAM", 1991 SYMPOSIUM ON VLSI CIRCUITS. To solve the problems of the circuit of FIG. 1, the word line boosting signal $\phi X$ is transferred to the word line through a PMOS transistor 30 which is a word line driver. That is, the device characteristics of the PMOS transistor are used. In FIG. 3, a latch circuit 40 is driven from decoded row address signals and the word line driver 30 is driven by the latch circuit 40. If the latch circuit 40 generates a pumping voltage Vpp (higher than a supply voltage Vcc and generated from, for example, a pumping circuit within the chip), the voltage of the word line WL is set to logic "low" level through an NMOS transistor 31. If the latch circuit 40 generates logic "low" level, the PMOS transistor 30 of the word line driver is turned on and the word line boosting signal $\phi X$ of the word line driver is directly transferred to the word line WL. Since the word line driver is the PMOS transistor 30, the output signal of the latch circuit 40 is not boosted. Therefore, the word line boosting signal $\phi X$ is transferred to the word line WL without boosting the gate voltage of the word line driver. The circuit of FIG. 3 ameliorates the aforementioned disadvantages, such as the deterioration of the operating characteristic and the reduction of the voltage boosting level of the word line WL caused by the insufficient precharge level of the gate voltage of the word line driver at the low supply voltage, and the reduction of the operating speed generated when the word line boosting signal $\phi X$ is applied after sufficiently precharging the gate voltage of the word line driver.

However, there are still drawbacks. That is, since the decoded row address signals RA0, . . . RA3 and a precharge control signal/PC perform a swing operation from a ground voltage Vss to a supply voltage Vcc and the operating voltages of input terminals 19, 20, . . . 25 are the supply voltage Vcc, the latch circuit 40 is necessarily needed. To design the word line driving circuit as shown in FIG. 3 in the memory cell array to which the design rule of submicron order is applied in proportion to the number of memory cells is very difficult and inefficient. Since the precharge control signal/PC and decoded row address signals RA0, . . . , RA3 are applied to the input terminals 19, 20, . . . , 25 and the decoded row address signals RA0, . . . RA3 of logic "low" level are applied after the precharge control signal/PC is fully set to logic "high" level, a delay phenomenon occurs due to the enable sequence of signals. Further, there is signal line loading of the precharge control signal/PC caused by applying the precharge control signal/PC to the multiple word line driving circuits which exist in the chip, and thus the channel size of the output terminal of a precharge control signal generating circuit should be enlarged. Hence, the output signal is delayed.

SUMMARY OF THE INVENTION

The present invention encompasses, in a preferred embodiment, a word line driving circuit for use in a semiconductor memory device having a first supply voltage to which a pumping voltage higher than a supply voltage supplied from the exterior of the memory device is applied and a second supply voltage to which a ground voltage is applied. The word line driving circuit includes a decoder circuit including a first pull-up transistor having a first electrode connected to the first supply voltage, a second pull-up transistor having a first electrode connected to the first supply voltage and a gate electrode connected to a second electrode of the first pull-up transistor, a plurality of driving transistors serially connected between the second electrode of the first pull-up transistor and the second supply voltage, the driving transistors being driven by decoded row address signals, and a first pull-down transistor having a first electrode connected to the second electrode of the second pull-up transistor and a gate electrode connected to the second electrode of the first pull-up transistor; a transfer circuit including a CMOS inverter having an input terminal connected to an output node of the decoder circuit, and a third pull-down transistor connected between an NMOS transistor of the CMOS inverter and the second supply voltage and controlled by a word line boosting signal; and, a word line output circuit including a third pull-up transistor having a first electrode connected to the first supply voltage, a fourth pull-up transistor having a first electrode connected to the first supply voltage, a second electrode connected to a word line, and a gate electrode connected to a second electrode of the fourth pull-up transistor and a gate electrode connected to an output node of the transfer circuit.

BRIEF DESCRIPTION OF THE DRAWINGS

FIG. 8 is a timing chart showing the voltage rising timing of each node of FIG. 7.

DETAILED DESCRIPTION OF THE PREFERRED EMBODIMENTS

Figure 1:
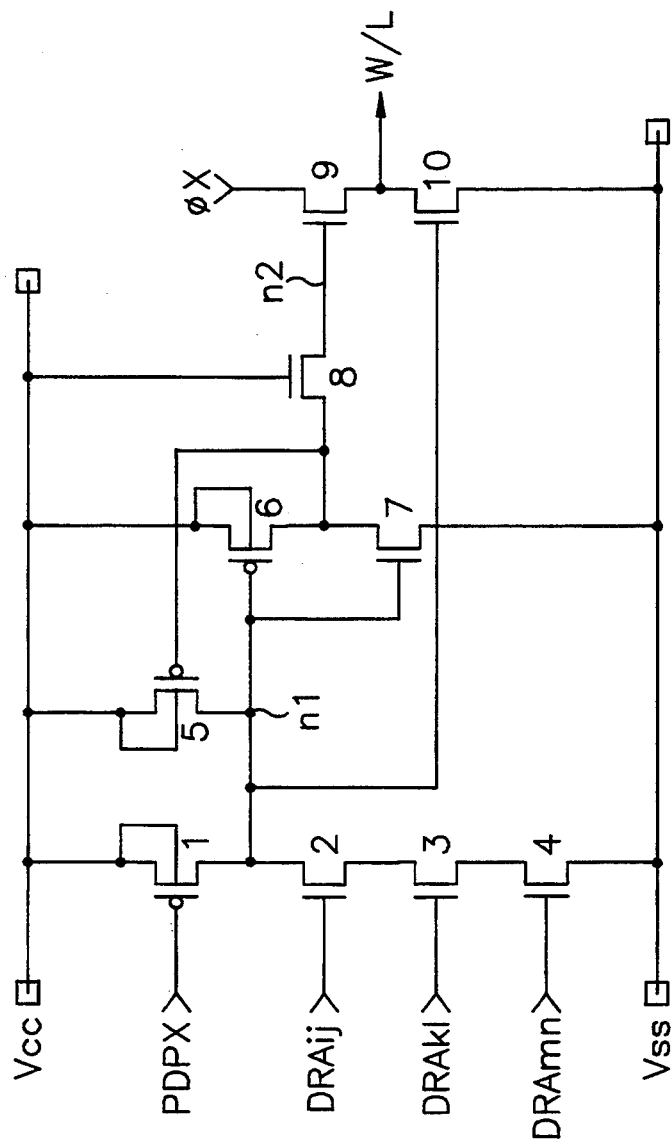
FIG. 1 is a circuit diagram showing an example of a conventional word line driving circuit.
Figure 2:
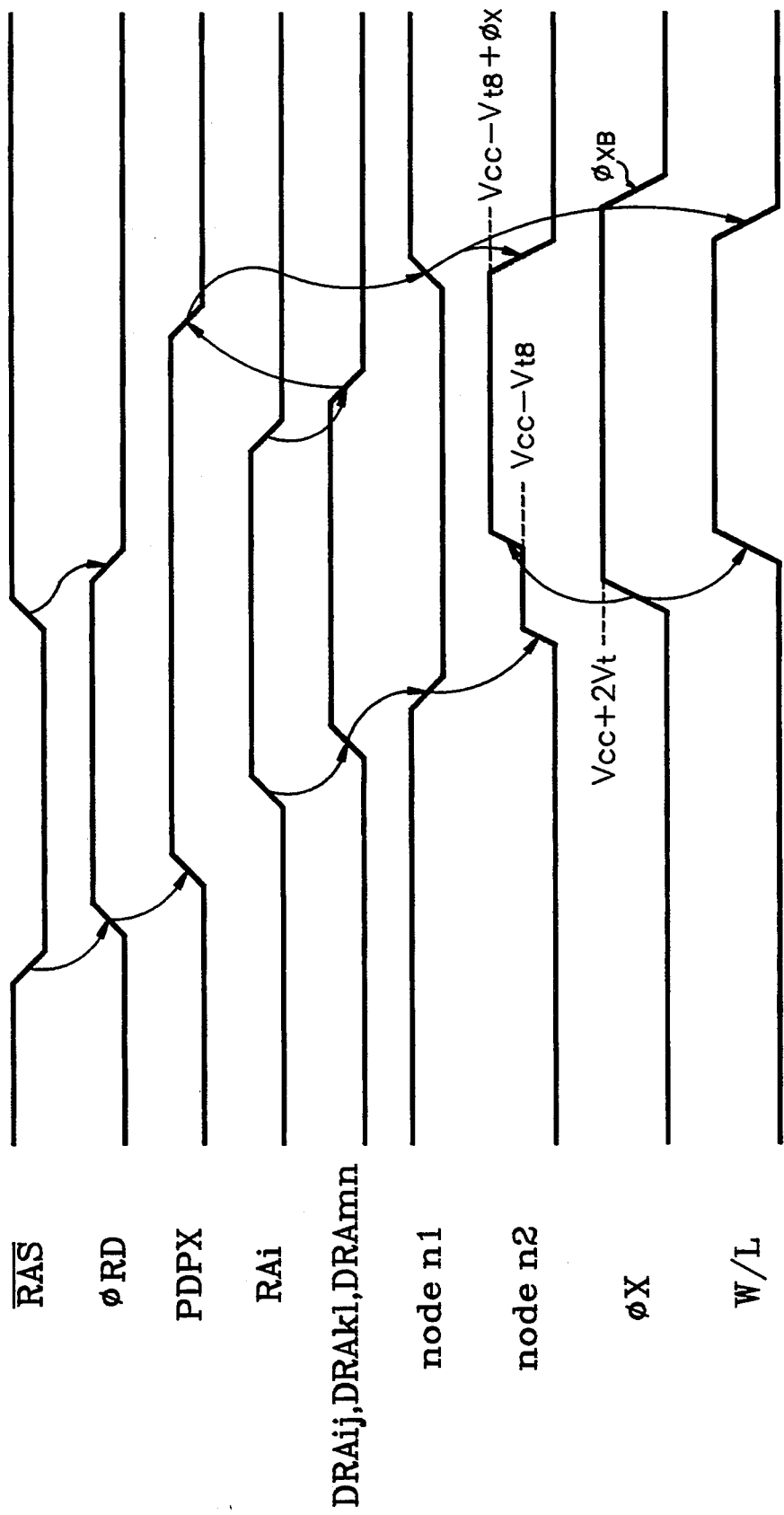
FIG. 2 is a timing chart showing the operation of FIG. 1.

In the following description, like reference numerals and symbols are used to designate like elements. Moreover, a word line driving circuit means a circuit for receiving a decoded row address generated by a given predecoder and supplying a predetermined voltage to a word line. A word line reset signal represents a control signal for precharging a word line to a predetermined voltage level when a word line is not selected. A word line driver indicates a circuit constituting an output stage of a word line driving circuit for directly supplying a given voltage to a word line.

Figure 4:
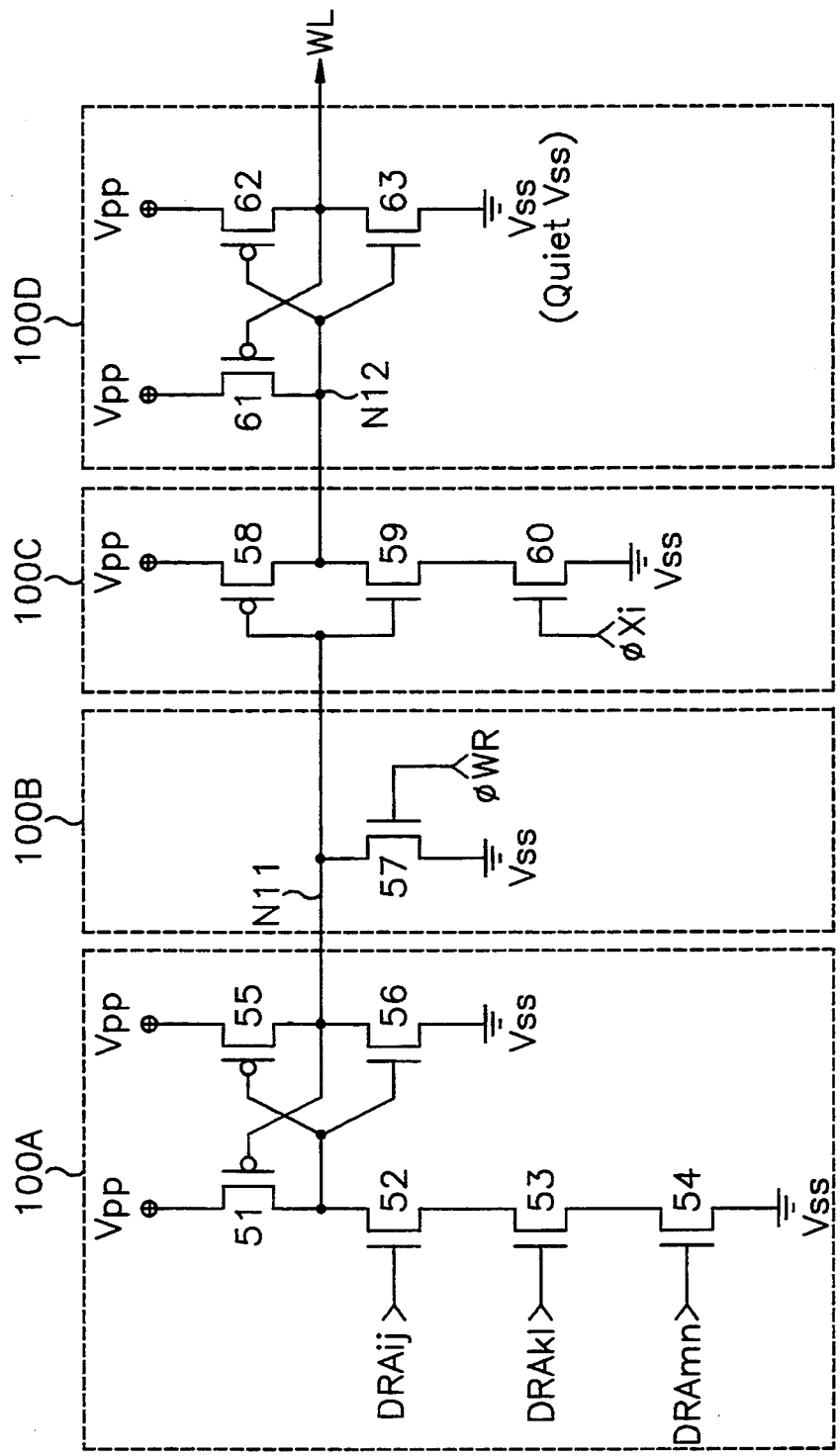
FIG. 4 is a circuit diagram of a word line driving circuit according to an embodiment of the present invention.

Referring to FIG. 4, a decoding circuit 100A is connected between a first supply voltage Vpp to which a pumping voltage greater than a supply voltage is applied and a second supply voltage Vss to which a ground voltage is applied and receives decoded row address signals DRAij, DRAkl and DRAmn. A precharge circuit 100B is connected to the output terminal of the decoding circuit 100A, a transfer circuit 100C receives the output signal of the decoding circuit 100A and a word line boosting signal $\emptyset$Xi. A word line output circuit 100D is formed between the first supply voltage Vpp and second supply voltage Vss and drives a word line WL. The decoding circuit 100A which is the input stage of the word line driving circuit includes a first pull-up transistor 51 the channel of which is connected to the first supply voltage Vpp, a second pull-up transistor 55 coupled in a latch configuration to the first pull-up transistor 51, a driving circuit consisting of transistors 52, 53 and 54, and a first pull-down transistor 56 the channel of which is serially connected to the second pull-up transistor 55 and the gate electrode of which is connected to a latch connecting terminal of the first pull-up transistor 51. The driving circuit is serially connected between the first pull-up transistor 51 and the second supply voltage Vss and is controlled by the decoded row address signals DRAij, DRAkl and DRAmn. The precharge circuit 100B has a second pull-down transistor 57 the channel of which is connected between an output node N11 of the decoding circuit 100A and the second supply voltage Vss. The second pull-down transistor 57 is controlled by a word line reset signal $\emptyset$WR. Although the precharge circuit 100B consists of an NMOS transistor, this is not limiting to the present invention. The transfer circuit 100C includes a CMOS inverter consisting of transistors 58 and 59 and a third pull-down transistor 60 the channel of which is connected between the NMOS transistor 59 and the second supply voltage Vss. The CMOS inverter has an input terminal connected to the output node N11 of the decoding circuit 100A. The third pull-down transistor 60 is controlled by the word line boosting signal $\emptyset$Xi. The word line output circuit 100D which is the output stage of the word line driving circuit includes a third pull-up transistor 61 the channel of which is connected to the first supply voltage Vpp, a fourth pull-up transistor the channel of which is connected to the first supply voltage Vpp and a fourth pull-down transistor 63 the channel of which is serially connected to the fourth pull-up transistor 62 and the gate of which is connected to an output node N12 of the transfer circuit 100C. A common connecting node between the fourth pull-up transistor 62 and the fourth pull-down transistor 63 is coupled to the word line WL. The decoded row address signals DRAij, DRAkl and DRAmn which are the control signals of the decoding circuit 100A are respectively supplied from a peripheral circuit of the semiconductor memory device.

Figure 5:
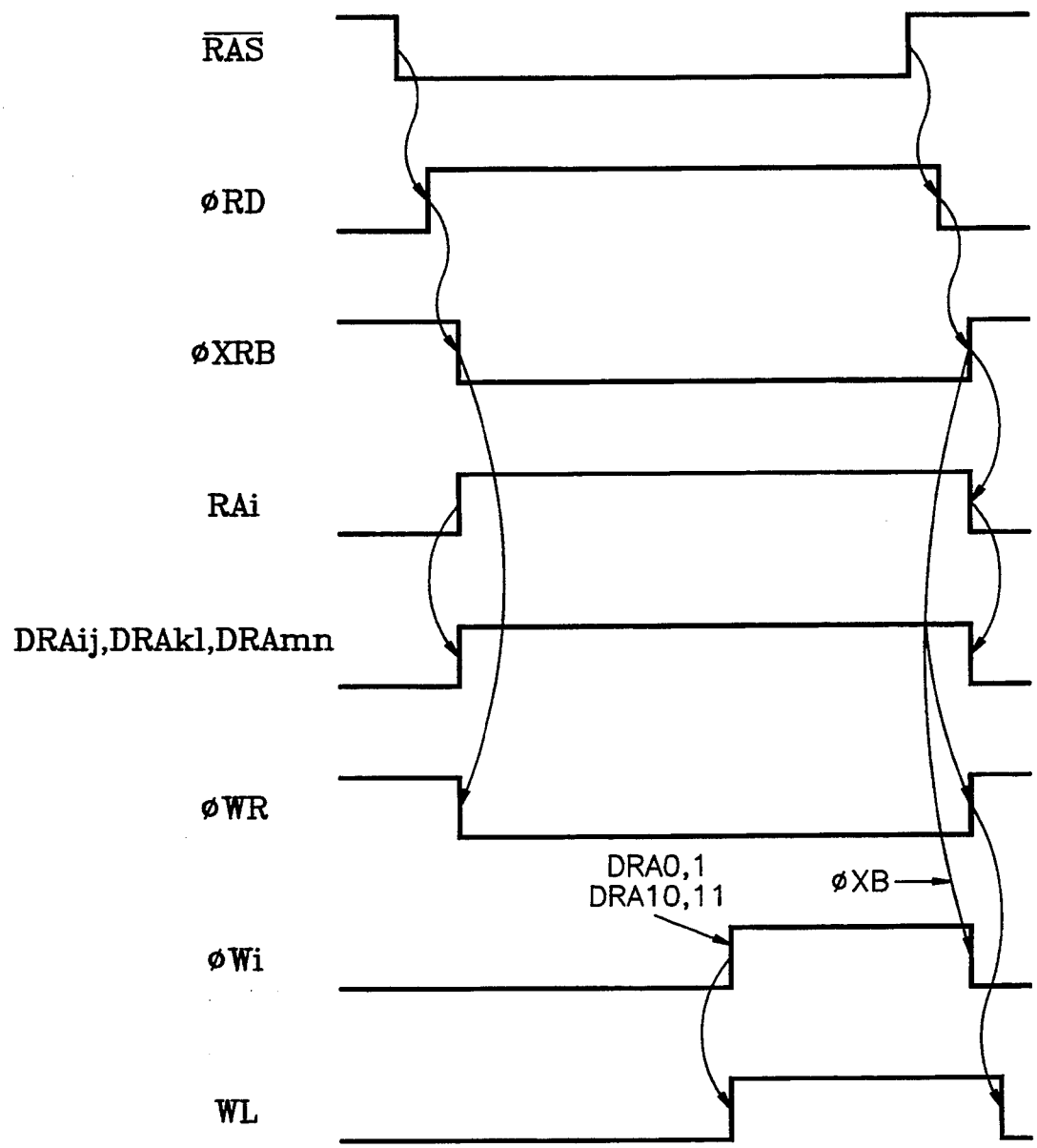
FIG. 5 is a timing chart showing a word line enabling operation of FIG. 4.

The operation of the word line driving circuit of FIG. 4 will now be described in detail with reference to FIG. 5. In the word line driving circuit shown in FIG. 4, it should be noted that the word line boosting signal $\emptyset$Xi is not directly connected to the word line WL but the first supply voltage Vpp is directly connected through the PMOS transistor 62 to the word line WL. In order to maintain the word line WL in a disable state during precharge, the word line output circuit 100D is constructed with a latch circuit and a precharge operation is implemented by the word line reset signal ØWR and the precharge transistor 57. The decoded row address signals DRAij, DRAkl and DRAmn are respectively generated from the peripheral and may be generated from the latch circuit 40 of FIG. 3. That is, if a given address enabled to a logic "high" level of a supply voltage Vcc of the chip is supplied from the exterior of the chip, this address is applied to the latch circuit (not shown) and the decoded row address signals DRAij, DRAkl and DRAmn of logic "high" level are applied to the word line driving circuit positioned within the memory cell array.

If the row address strobe signal/RAS is at a logic "high" level, i.e., a precharge state, since the row address is logic "low" level, the decoded row address signals DRAij, DRAkl and DRAmn are set to logic "low" level and the word line reset signal ØWR is set to logic "high" level. Therefore, the output node N11 of the decoding circuit 100A is set to logic "low" level and the output node N12 of the transfer circuit 100C is precharged to logic "high" level of the first supply voltage Vpp. The fourth pull-up transistor 62 of the word line output circuit 100D is turned off and the fourth pull-down transistor is turned on. Thus the word line WL is disabled. The word line boosting signal ØXi is maintained at logic "low" level and this signal is generated from a circuit such as the predecoder of FIG. 3.

If the row address strobe signal/RAS is at a logic "low" level, i.e., an active signal, the row address is applied and the decoded row address signals DRAij, DRAkl and DRAmn of logic "high" level are generated. The word line reset signal ØWR is set to logic "low" level and the precharge transistor 57 is turned off. The output node N11 of the decoding circuit 100A is charged to logic "high" level of the first supply voltage Vpp. Thereafter, if the word line boosting signal ØXi of logic "high" level is applied, the output node N12 is discharged to the ground voltage level of the second supply voltage Vss. Then the fourth pull-up transistor 62 is turned on and the first supply voltage Vpp is supplied to the word line WL. The second supply voltage Vss connected to the fourth pull-down transistor 63 of the word line output circuit 100D may use a typical ground voltage terminal, however, a quiet ground voltage terminal may be used to improve the noise characteristic. The quiet ground voltage terminal is a ground voltage terminal connected only to the word line driving circuit. The quiet ground voltage terminal branches off from a lead frame (or a pad) connected to a ground voltage pin included in a typical chip.

If the row address strobe signal/RAS is again set to logic "low" level, i.e., a precharge state, the decoded row address signals DRAij, DRAkl and DRAmn are set to logic "low" level and the word line reset signal ØWR is raised to logic "high" level. Then the output node N11 of the decoding circuit 100A is precharged to logic "low" level. The output node N12 of the transfer circuit 100C is precharged to logic "high" level and simultaneously the voltage of the word line is discharged through the channel of the fourth pull-down transistor 63.

Figure 3:
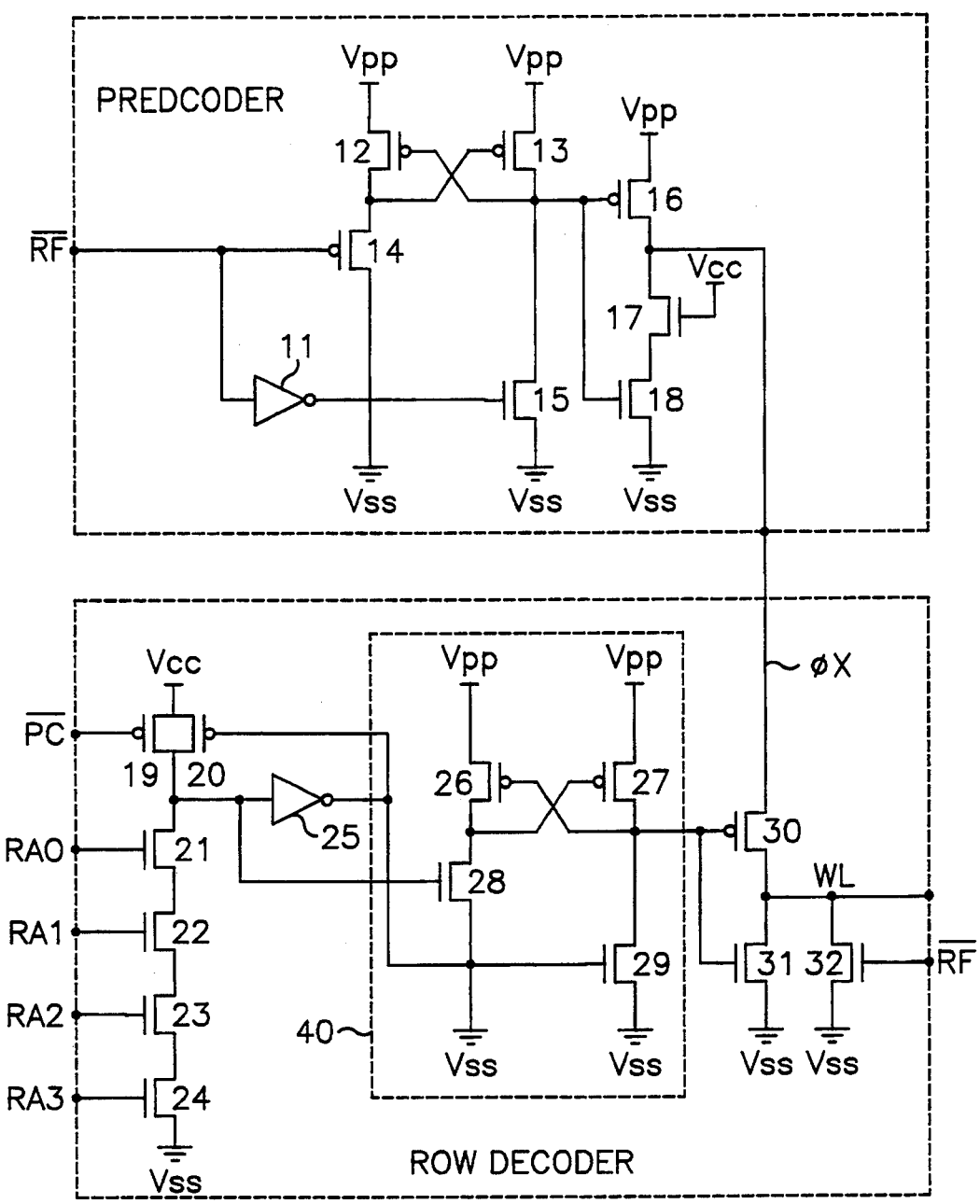
FIG. 3 is a circuit diagram showing another example of a conventional word line driving circuit.

Since the word line driver of the word line output circuit 100D is the PMOS transistor 62 like the circuit of FIG. 3, the disadvantages of the prior art circuit of FIG. 1 are solved. Moreover, in the circuit of FIG. 3, the decoded row address signals perform a swing operation from the ground voltage Vss to the supply voltage Vcc and thus the latch circuit is needed within the memory cell array (that is, within the word line driving circuit). However, in the circuit of FIG. 4, since the decoded row address signals are generated from the peripheral circuit of the memory cell array, the disadvantages of the circuit of FIG. 3 are overcome and the integration density of the chip is raised. Further, since the word line boosting signal ØXi is not directly connected to the word line WL, the enabling operation of the word line WL is implemented at high speed and a high voltage can be supplied to the word line WL through the first supply voltage Vpp. Furthermore, since the control signal applied to the decoding circuit 100A is only decoded row address signals DRAij, DRAkl and DRAmn and the circuit operation is enabled only by these decoded row address signals, the delay phenomenon and the deterioration of signal timing margins can be prevented. Further, signal line loading of the precharge control signal/PC of FIG. 3 is eliminated. Since the quiet ground voltage is used in the word line output circuit 100D when the voltage of the word line is discharged, the noise problem caused by the discharge of the word line voltage can be solved.

The results of a simulation of the operation of the circuit of FIG. 4 are shown in Table 1. Table 1 shows the enable time of the word line WL from that of the word line boosting signal ØXi at various supply voltage levels, for two cases, namely, where the word line driver 62 is an NMOS transistor or a PMOS transistor.

Table 1

|  | 2.0 V | 2.2 V | 2.4 V | 2.6 V | 2.8 V | 3.0 V |
| --- | --- | --- | --- | --- | --- | --- |
| PMOS | 2.98 ns | 2.34 ns | 1.89 ns | 1.54 ns | 1.24 ns | 1 ns |
| NMOS | 7.67 ns | 4.23 ns | 2.65 ns | 1.80 ns | 1.32 ns | 1 ns |

Figure 6:
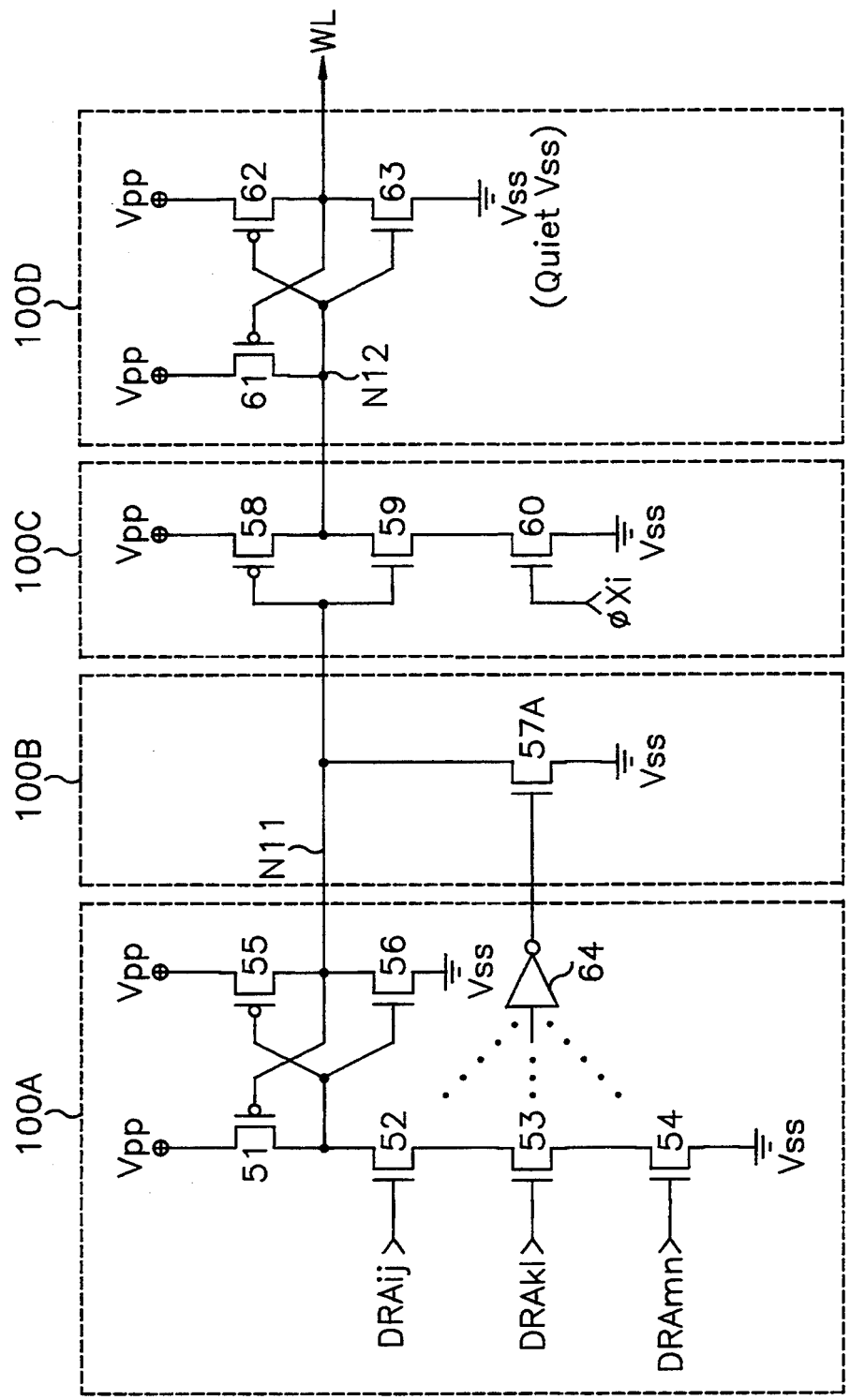
FIG. 6 is a circuit diagram of a word line driving circuit according to another embodiment of the present invention.

Another embodiment of the word line driving circuit is illustrated in FIG. 6. As shown, the circuit structure of FIG. 6 is the same as that of FIG. 4 except for the precharge circuit 100B. In FIG. 4, the precharge transistor 57 is controlled by the word line reset signal ØWR. However, in FIG. 6, a precharge transistor 57A is controlled by one of the decoded row address signals DRAij, DRAkl and DRAmn through an inverter 64. Since the word line reset signal ØWR is not connected to the word line driving circuit, the signal line loading of the word line reset signal ØWR does not occur. Therefore, power consumption is suppressed. The operating characteristics of FIG. 6 are similar to those of FIG. 4 and the operating timing chart of FIG. 6 is the same as that of FIG. 5 except for the word line reset signal ØWR.

Figure 7:
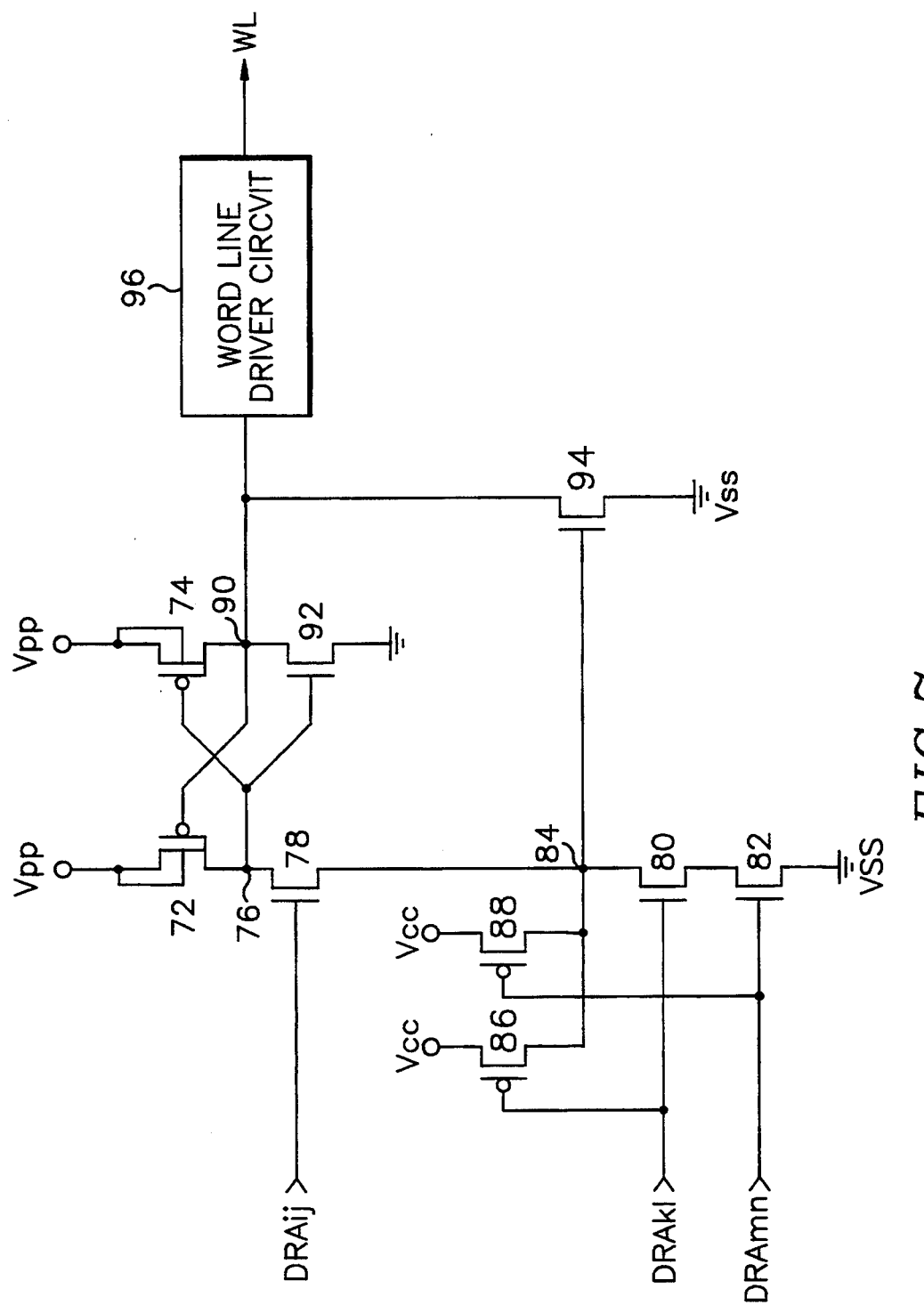
FIG. 7 is a circuit diagram of a word line driving circuit according to a further embodiment of the present invention.

FIG. 7 shows a word line driving circuit according to a further embodiment of the present invention. In FIG. 6, the precharge transistor 57A is controlled not by the word line reset signal ØWR but by any one of the decoded row address signals DRAij, DRAkl and DRAmn through the inverter 64. In FIG. 7, a precharge transistor 94 is controlled by the two decoded row address signals DRAkl and DRAmn to reduce power consumption. PMOS transistors 72 and 74 constituting a level converting circuit are respectively connected between the first supply voltage Vpp, and first and second nodes 76 and 90. NMOS transistors 78, 80 and 82 are respectively controlled by the decoded row address signals DRAij, DRAkl and DRAmn and serially connected between the first node 76 and the second supply voltage Vss. A PMOS transistor 86 has its gate connected to the decoded row address signal DRAkl and its channel connected between the supply voltage Vcc and a third node 84. A PMOS transistor 88 has its gate connected to the decoded row address signal DRAmn and its channel connected between the supply voltage Vcc and a third node 84. The precharge transistor 94 has its gate connected to the third node 84 and its channel connected between the second node 90 and the second supply voltage Vss. The word line driver circuit 96 may be implemented with the transfer circuit 100C and the word line output circuit 100D of FIG. 4 or FIG. 6. As shown, the PMOS transistors 86 and 88 each having one terminal of their respective channels connected to the third node 84 determine the precharge level of the third node 90 for determining the voltage of the word line.

Referring to FIG. 8, when the row address strobe signal/RAS is in a precharge state before an interval t1, the row address signals DRAij, DRAkl and DRAmn of logic "low" level are applied. Then the PMOS transistors 86 and 88 are turned on and the third node 84 is driven to the supply voltage Vcc. Then the precharge transistor 94 is turned on and the second node 90 is precharged to the second supply voltage Vss. This state is latched through the PMOS transistors 72 and 74. If the row address strobe signal/RAS is in an active state as between intervals t1 and t2, the decoded row address signals DRAij, DRAkl and DRAmn of logic "high" level are applied. The NMOS transistors 78, 80 and 82 are turned on. The PMOS transistors 86 and 88 are turned off and the third node 84 is discharged to the second supply voltage Vss through the channels of the NMOS transistors 80 and 82. The precharge transistor 94 is turned off. The first node 76 is set to the second supply voltage Vss and thus the PMOS transistor 74 is turned on, thereby supplying the first supply voltage Vpp to the second node 90. In this case, the precharge transistor 94 is maintained in a nonconductive state. The word line driver circuit 96 is driven by the second node 90 having a level of the first supply voltage Vpp, and as a result, a given word line is selected. On the other hand, when the row address strobe signal/RAS is again precharged as after the interval t2, if any one of the decoded row address signals DRAkl and DRAmn connected to the gates of the PMOS transistors 86 and 88 is disabled to logic "low" level, the third node 84 is set to logic "high" level and the precharge transistor 94 is turned on by the PMOS transistor 86 or 88. The NMOS transistors 80 and 82 are turned off and the discharge of the first node 76 is cut off. The second node 90 is set to the second supply voltage Vss through the precharge transistor 94. Thus the PMOS transistor 72 is turned on and the first node 76 is raised to the first supply voltage Vpp. Consequently, this state is latched. Therefore, there is no need to control the signal supply time between the word line reset signal ∅WR and the decoded row address signals DRAij, DRAkl and DRAmn, and the precharge operation of the second node 90 is stably performed by the decoded row address signals DRAkl and DRAmn. In FIG. 7, although the PMOS transistors 86 and 88 are controlled by the decoded row address signals DRAkl and DRAmn, the signals DRAij and DRAkl, or DRAij and DRAmn are also applicable.

As described above, in the word line driving circuit embodying the present invention, the input stage is driven only by the decoded row address signals and the word line boosting signal is not directly supplied to the word line. Further the latch circuit is formed at the output stage. Hence, the design and layout is simple and the efficiency of integration is improved. Since the enable sequence of an input signal is simple, the enable time of the input signal is performed at high speed and the reliability and performance can be improved. At a low supply voltage, high speed output operation is implemented and the noise problem is solved by using a quiet ground voltage terminal. Thus, the inventive word line driving circuit is useful for a highly integrated semiconductor memory device such as 64Mb, 256Mb, etc.

While there are shown and described the preferred embodiments of the invention, it will be understood by those skilled in the art that foregoing and other changes in form and details may be made without departing from the spirit and scope of the present invention.

What is claimed is:

1. A word line driving circuit for use in a semiconductor memory device having a first supply voltage to which a pumping voltage higher than a supply voltage supplied from the exterior of the memory device is applied, and a second supply voltage to which a ground voltage is applied, said word line driving circuit comprising:

decoding means connected between said first supply voltage and said second supply voltage, for receiving row address signals;

transfer means coupled to an output node of said decoding means and to a word line boosting signal;

word line driving circuit output means connected between said first supply voltage and said second supply voltage, and coupled to an output node of said transfer means, for driving a word line, in response to an output signal of said transfer means; and, wherein said second supply voltage connected to said word line driving circuit output means is coupled to a pad connected to a ground voltage pin of the semiconductor memory device and is only connected to said word line driving circuit.

2. The word line driving circuit as claimed in claim 1, further comprising precharge means connected to said output node of said decoding means, for precharging said output node of said decoding means.

3. The word line driving circuit as claimed in claim 2, wherein said precharge means comprises a pull-down transistor having a first electrode connected to said output node of said decoding means and is controlled by a word line reset signal.

4. A word line driving circuit for use in a semiconductor memory device having a first supply voltage to which a pumping voltage is applied and a second supply voltage to which a ground voltage is applied, said word line driving circuit comprising:

decoding means connected between said first supply voltage and said second supply voltage, for receiving decoded row address signals;

precharge means connected to an output terminal of said decoding means, for precharging said output terminal of said decoding means;

transfer means connected to said output terminal of said decoding means, said transfer means including a pull-down transistor controlled by a word line boosting signal; and, latch output means connected between said first supply voltage and said second supply voltage, and coupled to an output terminal of said transfer means, said latch output means including a pull-up transistor for supplying said first supply voltage to a word line.

5. The word line driving circuit as claimed in claim 4, wherein said second supply voltage connected to said latch output means branches off from a lead frame connected to a ground voltage pin of the semiconductor memory device and is connected only to said word line driving circuit, said lead frame being positioned within the semiconductor memory device.

6. The word line driving circuit as claimed in claim 4, wherein said decoding means comprises:

a first pull-up transistor having a first electrode connected to said first supply voltage;

a second pull-up transistor having a first electrode connected to said first supply voltage, and a gate electrode coupled to a second electrode of said first pull-up transistor;

driving transistors serially connected between said second electrode of said first pull-up transistor and said second supply voltage, said driving transistors being driven by said decoded row address signals; and, a first pull-down transistor having a first electrode connected to a second electrode of said second pull-up transistor and a gate electrode connected to said second electrode of said first pull-up transistor.

7. A word line driving circuit for use in a semiconductor memory device having a first supply voltage to which a pumping voltage is applied and a second supply voltage to which a ground voltage is applied, said word line driving circuit comprising:

decoding means connected between said first supply voltage and said second supply voltage, for receiving decoded row address signals;

control means connected to an output node of said decoding means, said control means receiving said decoded row address signals, wherein said control means and said decoding means are complementarily switched by said decoded row address signals; and, precharge means connected to said output node of said decoding means, for precharging said output node of said decoding means.

8. The word line driving circuit as claimed in claim 7, wherein said decoding means includes a plurality of NMOS transistors and said control means includes a plurality of PMOS transistors.

9. A word line driving circuit for use in a semiconductor memory device having a first supply voltage to which a pumping voltage higher than a supply voltage supplied from the exterior of the memory device is applied and a second supply voltage to which a ground voltage is applied, said word line driving circuit comprising:

a decoder circuit including a first pull-up transistor having a first electrode connected to said first supply voltage, a second pull-up transistor having a first electrode connected to said first supply voltage and a gate electrode connected to a second electrode of said first pull-up transistor, a plurality of driving transistors serially connected between said second electrode of said first pull-up transistor and said second supply voltage, said driving transistors being driven by decoded row address signals, and a first pull-down transistor having a first electrode connected to said second electrode of said second pull-up transistor and a gate electrode connected to said second electrode of said first pull-up transistor;

a transfer circuit including a CMOS inverter having an input terminal connected to an output node of said decoder circuit, and a third pull-down transistor connected between an NMOS transistor of said CMOS inverter and said second supply voltage and controlled by a word line boosting signal; and, a word line output circuit including a third pull-up transistor having a first electrode connected to said first supply voltage, a fourth pull-up transistor having a first electrode connected to said first supply voltage, a second electrode connected to a word line, and a gate electrode connected to a second electrode of said third pull-up transistor, and a fourth pull-down transistor having a first electrode connected to a second electrode of said fourth pull-up transistor and a gate electrode connected to an output node of said transfer circuit.

* * * * *